United States Patent
Takata et al.

(10) Patent No.: US 8,416,036 B2
(45) Date of Patent: Apr. 9, 2013

(54) BRANCHING FILTER

(75) Inventors: Toshiaki Takata, Nagaokakyo (JP); Yasuhiro Shimizu, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/487,432

(22) Filed: Jun. 4, 2012

(65) Prior Publication Data
US 2012/0235767 A1 Sep. 20, 2012

Related U.S. Application Data

(63) Continuation of application No. PCT/JP2010/060724, filed on Jun. 24, 2010.

(30) Foreign Application Priority Data

Dec. 25, 2009 (JP) ................................. 2009-294653

(51) Int. Cl.
H03H 9/72 (2006.01)
H03H 9/64 (2006.01)

(52) U.S. Cl.
USPC .......................................... 333/133; 333/193

(58) Field of Classification Search .................. 333/133, 333/193–196; 310/313 B, 313 D
See application file for complete search history.

(56) References Cited

U.S. PATENT DOCUMENTS

| | | | |
|---|---|---|---|
| 7,425,882 B2 * | 9/2008 | Takamine | 333/193 |
| 7,479,855 B2 * | 1/2009 | Yata | 333/196 |
| 2003/0042999 A1 * | 3/2003 | Takamine et al. | 333/195 |
| 2003/0146805 A1 * | 8/2003 | Sawada | 333/133 |
| 2004/0070470 A1 * | 4/2004 | Takamine | 333/195 |

(Continued)

FOREIGN PATENT DOCUMENTS

| EP | 2 015 451 A1 | 1/2009 |
|---|---|---|
| EP | 2 031 755 A1 | 3/2009 |

(Continued)

OTHER PUBLICATIONS

Official Communication issued in International Patent Application No. PCT/JP2010/060724, mailed on Aug. 24, 2010.

*Primary Examiner* — Barbara Summons
(74) *Attorney, Agent, or Firm* — Keating & Bennett, LLP

(57) ABSTRACT

A branching filter includes a longitudinally-coupled-resonator-type elastic wave filter having a balanced-unbalanced transformation function and the branching filter has excellent balance characteristics and a small size. The branching filter includes a ladder elastic wave filter chip and a longitudinally-coupled-resonator-type elastic wave filter chip. An antenna back-surface electrode and an antenna electrode pad are connected to each other via a first wiring provided in a wiring substrate. The antenna electrode pad and a longitudinally-coupled-resonator-type elastic wave filter are connected to each other via a second wiring provided on a piezoelectric substrate. The second wiring extends in a first direction and a first functional electrode and a second functional electrode provided on the piezoelectric substrate are axisymmetrically arranged with respect to each other about a central axis that extends in the first direction of the second wiring.

8 Claims, 15 Drawing Sheets

U.S. PATENT DOCUMENTS

| | | | |
|---|---|---|---|
| 2004/0155730 A1 | 8/2004 | Iwamoto et al. | |
| 2004/0207491 A1* | 10/2004 | Nakaya et al. | 333/195 |
| 2005/0212621 A1* | 9/2005 | Takamine | 333/195 |
| 2007/0152778 A1* | 7/2007 | Takamine | 333/195 |
| 2007/0159269 A1* | 7/2007 | Taniguchi | 333/133 |
| 2007/0229193 A1 | 10/2007 | Shibahara | |
| 2008/0266023 A1* | 10/2008 | Tanaka | 333/133 |
| 2009/0058555 A1* | 3/2009 | Takata et al. | 333/129 |
| 2011/0006855 A1 | 1/2011 | Fujiwara et al. | |
| 2011/0109400 A1* | 5/2011 | Koga et al. | 333/4 |

FOREIGN PATENT DOCUMENTS

| | | |
|---|---|---|
| JP | 2003-249842 A | 9/2003 |
| JP | 2004-080233 A | 3/2004 |
| JP | 2005-294891 A | 10/2005 |
| WO | 2006/068087 A1 | 6/2006 |
| WO | 2007/116760 A1 | 10/2007 |
| WO | 2007/145049 A1 | 12/2007 |
| WO | WO 2009/028683 * | 3/2009 |
| WO | 2009/113274 A1 | 9/2009 |

* cited by examiner

BRANCHING FILTER

BACKGROUND OF THE INVENTION

1. Field of the Invention

The present invention relates to branching filters. In particular, the present invention relates to branching filters that include a ladder elastic wave filter connected between an antenna terminal and a transmission signal terminal and a longitudinally-coupled-resonator-type elastic wave filter that is connected between the antenna terminal and first and second reception balanced signal terminals and that has a balanced-unbalanced transformation function.

2. Description of the Related Art

In recent years, elastic wave branching filters, which utilize elastic waves, such as surface acoustic waves or boundary acoustic waves, have been widely used as branching filters that separate transmission signals and reception signals transmitted from and received by an antenna.

For example, in PCT International Publication No. WO 2007/116760 A1, a duplexer is described that includes a ladder elastic wave filter having a high electric power handling capability as a transmission filter and a longitudinally-coupled-resonator-type elastic wave filter having a balanced-unbalanced transformation function as a reception filter.

In the duplexer described in PCT International Publication No. WO 2007/116760 A1 that includes a longitudinally-coupled-resonator-type elastic wave filter having a balanced-unbalanced transformation function as a reception filter or a transmission filter (hereafter "balanced duplexer"), excellent balance characteristics are required between the first and second balanced signal terminals. Consequently, it has been necessary that IDT electrodes, wiring and other elements be arranged such that the balance characteristics between the first and second balanced signal terminals are excellent and, as a result, there have been severe constraints on the structure of electrodes in balanced duplexers. Therefore, size reduction has been difficult to achieve in balanced duplexers.

SUMMARY OF THE INVENTION

To overcome the problems described above, preferred embodiments of the present invention provide a branching filter that includes a longitudinally-coupled-resonator-type elastic wave filter having a balanced-unbalanced transformation function, has excellent balance characteristics, and has a small size.

A branching filter according to a preferred embodiment of the present invention preferably includes an antenna terminal, a transmission signal terminal, and first and second reception balanced signal terminals. The branching filter according to this preferred embodiment of the present invention preferably includes a wiring substrate, a ladder elastic wave filter chip, and a longitudinally-coupled-resonator-type elastic wave filter chip. The wiring substrate includes first and second main surfaces. The ladder elastic wave filter chip is mounted on the first main surface of the wiring substrate. The ladder elastic wave filter chip preferably includes a piezoelectric substrate and a ladder elastic wave filter. The ladder elastic wave filter is provided on the piezoelectric substrate. The ladder elastic wave filter is connected between the antenna terminal and the transmission signal terminal. The longitudinally-coupled-resonator-type elastic wave filter chip is mounted on the first main surface of the wiring substrate. The wiring substrate includes an antenna back-surface electrode and a first wiring. The antenna back-surface electrode is provided on the second main surface. The antenna back-surface electrode is connected to the antenna terminal. The first wiring is connected to the antenna back-surface electrode. The longitudinally-coupled-resonator-type elastic wave filter chip preferably includes a piezoelectric substrate, a longitudinally-coupled-resonator-type elastic wave filter, an antenna electrode pad, and a second wiring. The longitudinally-coupled-resonator-type elastic wave filter is provided on the piezoelectric substrate. The longitudinally-coupled-resonator-type elastic wave filter is connected between the antenna terminal and the first and second reception balanced signal terminals. The longitudinally-coupled-resonator-type elastic wave filter has a balanced-unbalanced transformation function. The antenna electrode pad is provided on the piezoelectric substrate. The antenna electrode pad is connected to the antenna back-surface electrode through the first wiring. The second wiring is provided on the piezoelectric substrate. The second wiring connects the antenna electrode pad and the longitudinally-coupled-resonator-type elastic wave filter. The longitudinally-coupled-resonator-type elastic wave filter preferably includes a first functional electrode and a second functional electrode. The first functional electrode is connected between the second wiring and the first reception balanced signal terminal. The second functional electrode is connected between the second wiring and the second reception balanced signal terminal. The second wiring extends in a first direction. The first functional electrode and the second functional electrode are axisymmetrically arranged with respect to each other about a central axis that extends in the first direction of the second wiring. The ladder elastic wave filter chip preferably has a long narrow shape whose longitudinal direction is parallel or substantially parallel to a second direction, which is perpendicular or substantially perpendicular to the first direction.

In preferred embodiments of the present invention, the term "functional electrode" refers to an electrode that is involved in propagation of an elastic wave.

In preferred embodiments of the present invention, it is assumed that the term "first wiring" refers to a portion of an electrode, which connects the antenna back-surface electrode and the antenna electrode pad and extends in an in-plane direction. That is, of the electrode connecting the antenna back-surface electrode and the antenna electrode pad, it is assumed that via hole electrodes that extend in a perpendicular or substantially perpendicular direction are not included in the first wiring.

According to a preferred embodiment of the present invention, the antenna electrode pad is preferably provided at a different position from the antenna back-surface electrode when viewed in plan.

According to another preferred embodiment of the present invention, the first wiring is preferably disposed inside the wiring substrate or on the second main surface of the wiring substrate. With this configuration, the generation of electromagnetic field coupling between the first wiring and the first or second functional electrode is minimized or prevented. Therefore, improved balance characteristics and isolation characteristics are achieved. Furthermore, the degree of precision required to position and mount the longitudinally-coupled-resonator-type elastic wave filter chip is reduced and duplexers can be efficiently manufactured.

According to another preferred embodiment of the present invention, the first wiring is preferably superposed with at least one of the first and second functional electrodes in the first direction.

According to another preferred embodiment of the present invention, the first functional electrode preferably includes a first longitudinally-coupled-resonator-type elastic wave filter including a plurality of IDT electrodes arranged along the elastic wave propagation direction parallel or substantially parallel to the first direction, the second functional electrode preferably includes a second longitudinally-coupled-resonator-type elastic wave filter including a plurality of IDT electrodes provided along the elastic wave propagation direction parallel to the first direction, and the first longitudinally-coupled-resonator-type elastic wave filter and the second longitudinally-coupled-resonator-type elastic wave filter are preferably arranged along the second direction. With this configuration, the size of the branching filter is further reduced.

According to another preferred embodiment of the present invention, the first functional electrode preferably further includes a third longitudinally-coupled-resonator-type elastic wave filter that is cascade-connected with the first longitudinally-coupled-resonator-type elastic wave filter between the first longitudinally-coupled-resonator-type elastic wave filter and the first reception balanced signal terminal, the second functional electrode preferably further includes a fourth longitudinally-coupled-resonator-type elastic wave filter that is cascade-connected with the second longitudinally-coupled-resonator-type elastic wave filter between the second longitudinally-coupled-resonator-type elastic wave filter and the second reception balanced signal terminal, and the first to fourth longitudinally-coupled-resonator-type elastic wave filters are arranged along the second direction.

According to another preferred embodiment of the present invention, the longitudinally-coupled-resonator-type elastic wave filter preferably includes first to fifth IDT electrodes arranged along the elastic wave propagation direction parallel or substantially parallel to the second direction, at least a portion of the first functional electrode is defined by the first and second IDT electrodes and a portion of the third IDT electrode, and at least a portion of the second functional electrode is defined by the fourth and fifth IDT electrodes and the remaining portion of the third IDT electrode.

According to another preferred embodiment of the present invention, the piezoelectric substrate of the ladder filter and the piezoelectric substrate of the longitudinally-coupled-resonator-type elastic wave filter are preferably provided in an integrated manner.

According to another preferred embodiment of the present invention, the ladder filter and the longitudinally-coupled-resonator-type elastic wave filter are surface acoustic wave filters that utilize surface acoustic waves or boundary acoustic wave filters that utilize boundary acoustic waves.

In various preferred embodiments of the present invention, the first functional electrode and the second functional electrode are preferably axisymmetrically arranged with respect to each other about a central axis that extends in the first direction of the second wiring that connects the antenna electrode pad and the longitudinally-coupled-resonator-type elastic wave filter. Accordingly, it is not likely that a difference in parasitic capacitance values will arise between the second wiring and the longitudinally-coupled-resonator-type elastic wave filter and degrade the balance characteristics. Furthermore, as long as the first functional electrode and the second functional electrode are axisymmetrically arranged with respect to each other about the central axis that extends in the first direction of the second wiring, there are no particular restrictions on the electrode structure. Therefore, an electrode structure is adopted that is advantageous in terms of size reduction. Therefore, according to various preferred embodiments of the present invention, both realization of excellent balance characteristics and reduction of size can be achieved.

The above and other elements, features, steps, characteristics, and advantages of the present invention will become more apparent from the following detailed description of the preferred embodiments with reference to the attached drawings.

DETAILED DESCRIPTION OF THE PREFERRED EMBODIMENTS

Hereafter, preferred embodiments of the present invention will be described by using a duplexer 1 illustrated in FIG. 1 as an example. However, the duplexer 1 is merely an illustrative example. Branching filters according to preferred embodiments of the present invention are in no way limited to the duplexer 1. A branching filter according to preferred embodiments of the present invention, for example, may be a duplexer other than the duplexer 1 or may be a triplexer or other suitable component.

The duplexer 1 of the present preferred embodiment of the present invention preferably is a UMTS Band 8 duplexer having a transmission filter pass band (Tx) of about 880 MHz to about 915 MHz and a reception filter pass band (Rx) of about 925 MHz to about 960 MHz. An antenna matching circuit is provided separately from the duplexer 1.

Figure 1:
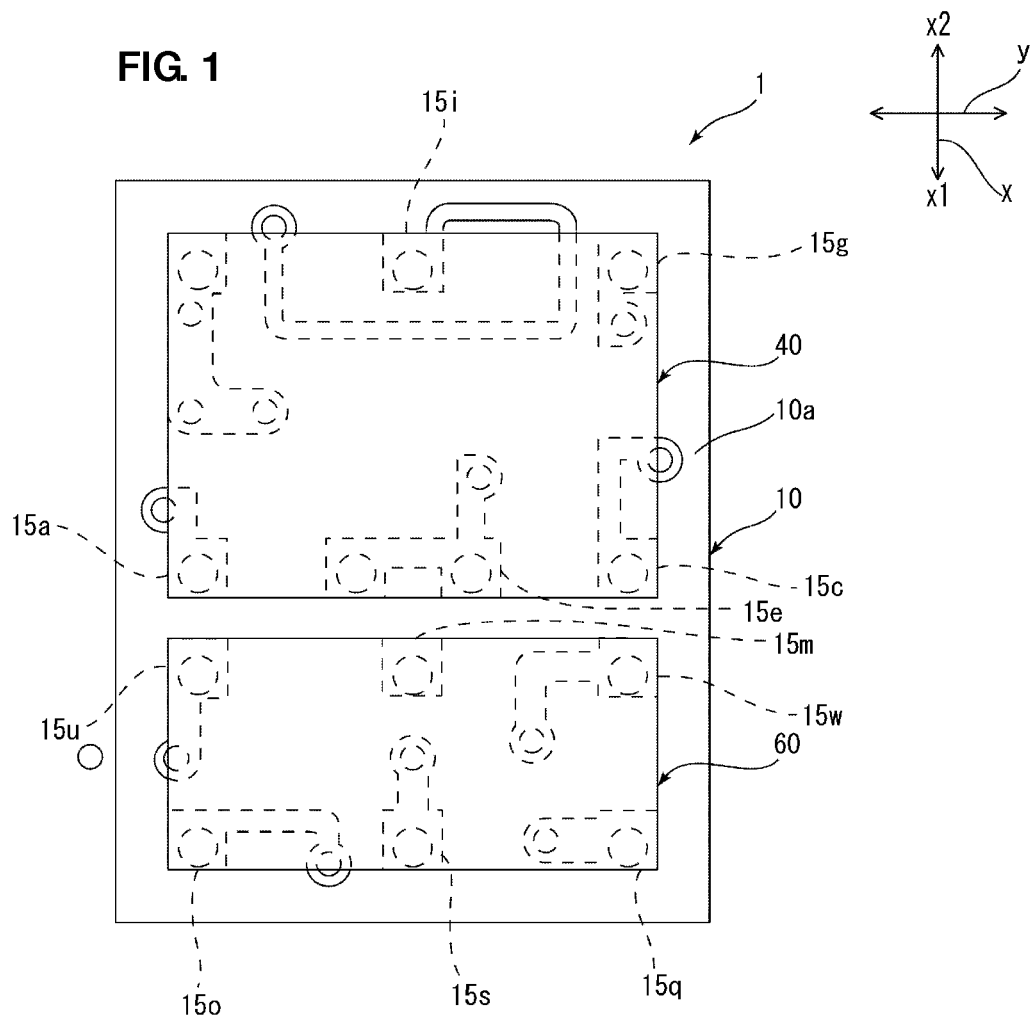
FIG. 1 is a schematic plan view of a duplexer according to a first preferred embodiment of the present invention.
Figure 2:
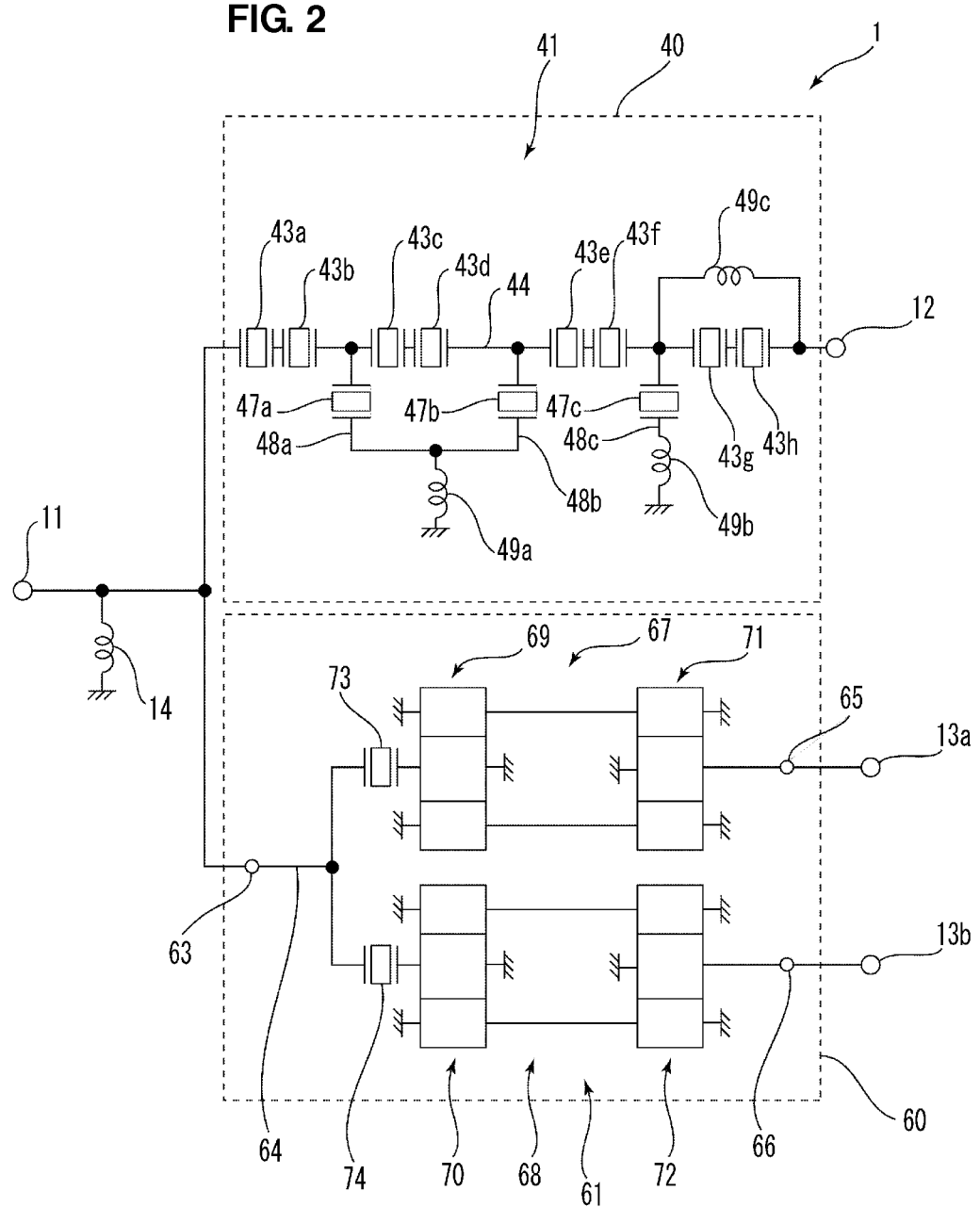
FIG. 2 is an equivalent circuit diagram of the duplexer according to the first preferred embodiment of the present invention.
Figure 3:
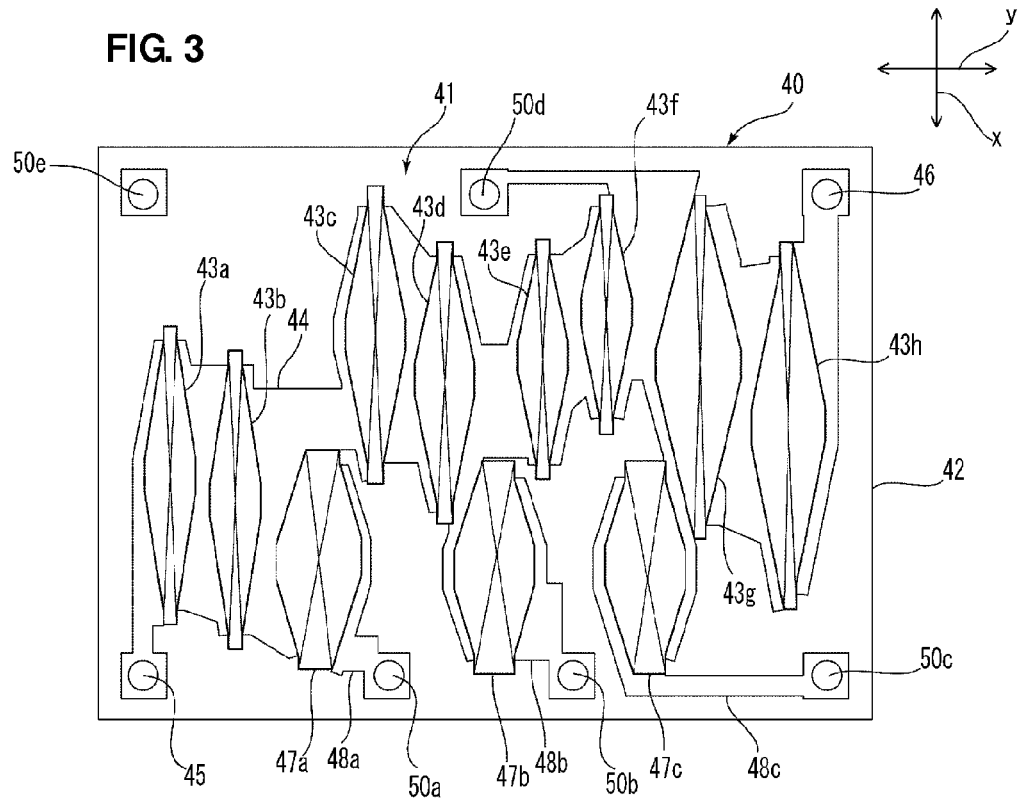
FIG. 3 is a schematic planar transparent view of a ladder elastic wave filter chip in the first preferred embodiment of the present invention.
Figure 4:
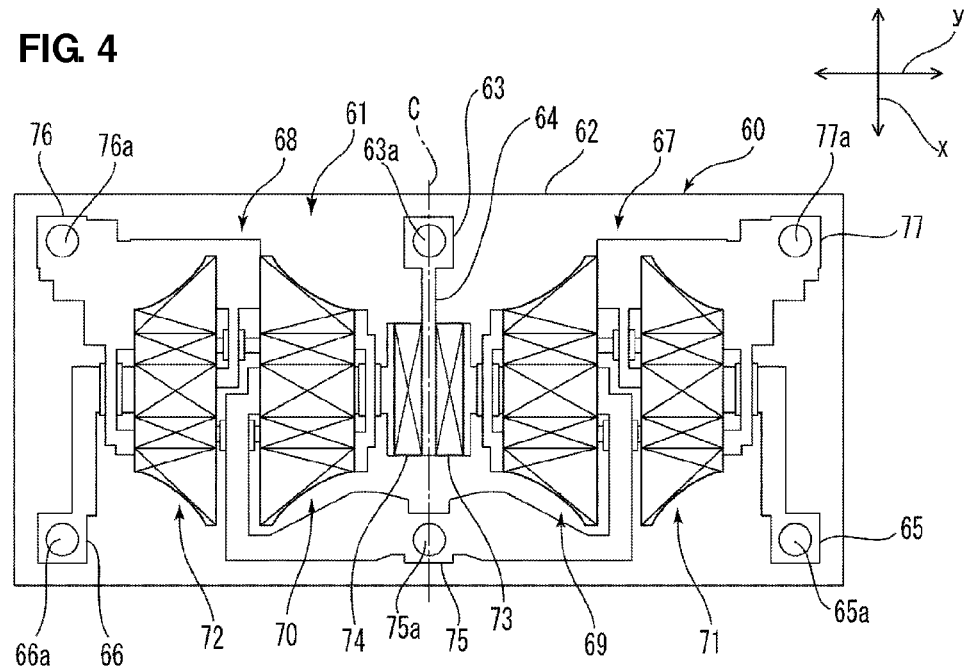
FIG. 4 is a schematic planar transparent view of a longitudinally-coupled-resonator-type elastic wave filter chip in the first preferred embodiment of the present invention.

FIG. 1 is a schematic plan view of a duplexer according to a first preferred embodiment of the present invention. FIG. 2 is an equivalent circuit diagram of the duplexer according to the first preferred embodiment. FIG. 3 is a schematic plan view of a ladder elastic wave filter chip in the first preferred embodiment. FIG. 4 is a schematic plan view of a longitudinally-coupled-resonator-type elastic wave filter chip in the first preferred embodiment.

In the drawings, IDT electrodes are schematically shown as rectangular shapes drawn using only rectangles or rectangles with diagonal lines. Furthermore, drawings of reflectors are omitted from FIG. 2, FIG. 16, and elsewhere.

As illustrated in FIG. 1, the duplexer 1 preferably includes a wiring substrate 10, a ladder elastic wave filter chip 40, and a longitudinally-coupled-resonator-type elastic wave filter chip 60. The wiring substrate 10 includes a first main surface 10a, which defines a die-attach surface, and a second main surface 10b (refer to FIG. 8). The ladder elastic wave filter chip 40 and the longitudinally-coupled-resonator-type elastic wave filter chip 60 are mounted face down on the first main surface 10a of the wiring substrate 10 preferably through bump electrodes composed of solder, Au, or other suitable material, for example.

As illustrated in FIG. 2 and FIG. 3, the ladder elastic wave filter chip 40 includes a ladder elastic wave filter 41. The ladder elastic wave filter 41 defines a transmission filter of the duplexer 1. As illustrated in FIG. 2, the ladder elastic wave filter 41 is connected between an antenna terminal 11 and a transmission signal terminal 12.

In contrast, as illustrated in FIG. 2 and FIG. 4, the longitudinally-coupled-resonator-type elastic wave filter chip 60 includes a longitudinally-coupled-resonator-type elastic wave filter 61. The longitudinally-coupled-resonator-type elastic wave filter 61 defines a reception filter of the duplexer 1. The longitudinally-coupled-resonator-type elastic wave filter 61 is preferably a balanced elastic wave filter having a balanced-unbalanced transformation function. As illustrated in FIG. 2, the longitudinally-coupled-resonator-type elastic wave filter 61 is connected between the antenna terminal 11 and first and second reception balanced signal terminals 13a and 13b.

As illustrated in FIG. 2, an inductor 14 is connected between a connection point connecting the ladder elastic wave filter 41, the longitudinally-coupled-resonator-type elastic wave filter 61, and the antenna terminal 11 with each other, and the ground potential. The inductor 14 is preferably an antenna-matching inductor.

Next, the configuration of the ladder elastic wave filter chip 40 will be described in detail with reference to FIGS. 1 to 3.

As illustrated in FIG. 1 and FIG. 3, the ladder elastic wave filter chip 40 preferably has a long narrow shape whose longitudinal direction is parallel or substantially parallel to a second direction y. Specifically, the ladder elastic wave filter chip 40 preferably has a rectangular or substantially rectangular shape whose longitudinal direction is parallel or substantially parallel to the second direction y.

As illustrated in FIG. 3, the ladder elastic wave filter chip 40 includes a piezoelectric substrate 42. The ladder elastic wave filter 41 is provided on the piezoelectric substrate 42. Here, for the sake of convenience, the ladder elastic wave filter 41 is illustrated so as to be transparently seen from the back-surface side of the piezoelectric substrate 42. A plurality of series-arm resonators 43a to 43h is included in the ladder elastic wave filter 41. The plurality of series-arm resonators 43a to 43h are connected in series between the antenna terminal 11 and the transmission signal terminal 12 and define a series arm 44. As illustrated in FIG. 3, an end portion on one side of the series arm 44 is connected to a bump electrode 45 provided on the piezoelectric substrate 42 and an end portion on the other side of the series arm 44 is connected to a bump electrode 46. The bump electrode 45, as will be described in detail below, is connected to the antenna terminal through the wiring substrate 10. The bump electrode 46 is connected to the transmission signal terminal 12 through the wiring substrate 10.

An inductor 49c is connected in parallel with the series-arm resonators 43g and 43h in the series arm 44. As will be described below, the inductor 49c is disposed in the wiring substrate 10 and the series-arm resonators 43g and 43h are connected to the inductor 49c through bump electrodes 46 and 50d illustrated in FIG. 3.

As illustrated in FIG. 2 and FIG. 3, parallel-arm resonators 47a to 47c, which respectively define parallel arms 48a to 48c, are connected between the series arm 44 and the ground potential. Specifically, the parallel-arm resonator 47a is connected to a bump electrode 50a provided on the piezoelectric substrate 42 and the bump electrode 50a is connected to the ground potential through the wiring substrate 10, as will be described below. The parallel-arm resonator 47b is connected to a bump electrode 50b provided on the piezoelectric substrate 42 and the bump electrode 50b is connected to the ground potential through the wiring substrate 10, as will be described below. The parallel-arm resonator 47c is connected to a bump electrode 50c provided on the piezoelectric substrate 42 and the bump electrode 50c is connected to the ground potential through the wiring substrate 10, as will be described below.

An inductor 49a is connected between a connection point between the parallel-arm resonator 47a and the parallel-arm resonator 47b, and the ground potential. Furthermore, an inductor 49b is connected between the parallel-arm resonator 47c and the ground potential.

Next, the configuration of the longitudinally-coupled-resonator-type elastic wave filter chip 60 will be described in detail with reference to FIG. 1, FIG. 2, and FIG. 4.

As illustrated in FIG. 1 and FIG. 4, the longitudinally-coupled-resonator-type elastic wave filter chip preferably has a long narrow shape whose longitudinal direction is parallel or substantially parallel to the second direction y. Specifically, the longitudinally-coupled-resonator-type elastic wave filter chip 60 preferably has a rectangular or substantially rectangular shape whose longitudinal direction is parallel or substantially parallel to the second direction y.

As illustrated in FIG. 4, the longitudinally-coupled-resonator-type elastic wave filter chip 60 preferably includes a piezoelectric substrate 62, a longitudinally-coupled-resonator-type elastic wave filter 61, an antenna electrode pad 63, a second wiring 64, and electrode pads 65 and 66. The longitudinally-coupled-resonator-type elastic wave filter 61, the antenna electrode pad 63, the second wiring 64, and the electrode pads 65 and 66 are each provided on the piezoelectric substrate 62. Here, for the sake of convenience, the longitudinally-coupled-resonator-type elastic wave filter 61, the antenna electrode pad 63, the second wiring 64, and the electrode pads 65 and 66 are illustrated so as to be seen transparently from the back surface side of the piezoelectric substrate 62. The second wiring 64 connects the antenna electrode pad 63 and the longitudinally-coupled-resonator-type elastic wave filter 61. As illustrated in FIG. 4, the antenna electrode pad 63 is a component in the approximate center of the piezoelectric substrate 62 in the second direction y and is provided in an end portion of the piezoelectric substrate 62 in the first direction x on the ladder elastic wave filter chip 40 side. The antenna electrode pad 63, as will be described below, is connected to an antenna back surface electrode 17s through the first wiring 18 provided in the wiring substrate 10.

The electrode pad 65 is positioned in an end portion of the piezoelectric substrate 62 on one side in the second direction y and the electrode pad 66 is positioned in an end portion of the piezoelectric substrate 62 on the other side in the second direction y. The electrode pads 65 and 66 are positioned in an end portion of the piezoelectric substrate 62 in the first direction x on a side opposite to the side on which the ladder elastic wave filter chip 40 is positioned. The electrode pad 65 is connected to the first reception balanced signal terminal 13a through the wiring substrate 10. In contrast, the electrode pad 66 is connected to the second reception balanced signal terminal 13b through the wiring substrate 10.

The longitudinally-coupled-resonator-type elastic wave filter 61 includes first and second functional electrodes 67 and 68. The first functional electrode 67 is connected between the second wiring 64 and the electrode pad 65. The second functional electrode 68 is connected between the second wiring 64 and the electrode pad 66. The first and second functional electrodes 67 and 68 are defined by portions of the electrodes of the longitudinally-coupled-resonator-type elastic wave filter 61 that are involved in propagation of an elastic wave.

Specifically, in this preferred embodiment, the first and second functional electrodes 67 and 68 are preferably defined by IDT electrodes and reflectors included in the longitudinally-coupled-resonator-type elastic wave filter 61.

The first functional electrode 67 includes first and third longitudinally-coupled-resonator-type elastic wave filters and 71 and an elastic wave resonator 73 which defines a series-connected trap. The elastic wave resonator 73 is connected between the second wiring 64 and the first longitudinally-coupled-resonator-type elastic wave filter 69.

The first and third longitudinally-coupled-resonator-type elastic wave filters 69 and 71 are cascade-connected between the second wiring 64 and the first reception balanced signal terminal 13a. The first and third longitudinally-coupled-resonator-type elastic wave filters 69 and 71 each preferably include three IDT electrodes arranged along the first direction x, which is the elastic wave propagation direction, and a pair of reflectors arranged on either side in the first direction x of the region in which the three IDT electrodes are provided.

Similarly, the second functional electrode 68 includes second and fourth longitudinally-coupled-resonator-type elastic wave filters 70 and 72 and an elastic wave resonator 74 which defines a series-connected trap. The elastic wave resonator 74 is connected between the second wiring 64 and the second longitudinally-coupled-resonator-type elastic wave filter 70.

The second and fourth longitudinally-coupled-resonator-type elastic wave filters 70 and 72 are cascade-connected between the second wiring 64 and the second reception balanced signal terminal 13b. The second and fourth longitudinally-coupled-resonator-type elastic wave filters 70 and 72 each preferably include three IDT electrodes arranged along the first direction x, which is the elastic wave propagation direction, and a pair of reflectors arranged on either side in the first direction x of the region in which the three IDT electrodes are provided.

In this preferred embodiment, the first functional electrode 67 and the second functional electrode 68 are preferably axisymmetrically provided with respect to each other about a central axis C that extends in the first direction x of the second wiring 64 extending in the first direction x.

As illustrated in FIG. 1 and FIG. 4, in this preferred embodiment, the first to fourth longitudinally-coupled-resonator-type elastic wave filters 69 to 72 are arranged along the second direction y.

Electrode pads 75 to 77 formed on the piezoelectric substrate 62 are ground electrode pads connected to the ground potential through the wiring substrate 10. Furthermore, bump electrodes 63a, 65a, 66a and 75a to 77a are respectively provided on the electrode pads 63, 65, 66 and 75 to 77.

In this preferred embodiment, the materials of the piezoelectric substrates 42 and 62 are not particularly limited. The piezoelectric substrates 42 and 62 may preferably be, for example, $LiNbO_3$ substrates, $LiTaO_3$ substrates or other suitable piezoelectric substrates. Moreover, in this preferred embodiment, the materials of the various electrodes, such as the acoustic resonators, IDT electrodes, reflectors, wirings and other electrodes are not particularly limited. The electrodes may preferably be made of conductive materials, such as metals like Al, Pt, Au, Ag, Cu, Ti, Ni, Cr and Pd or alloys containing at least one of these metals, for example. Furthermore, the electrodes may preferably be made of conductive film laminates, for example, in which a plurality of conductive films are stacked.

In addition, in this preferred embodiment, the ladder elastic wave filter 41 and the longitudinally-coupled-resonator-type elastic wave filter 61 may preferably be surface acoustic wave filters utilizing surface acoustic waves. As illustrated in FIG.

Figure 18:
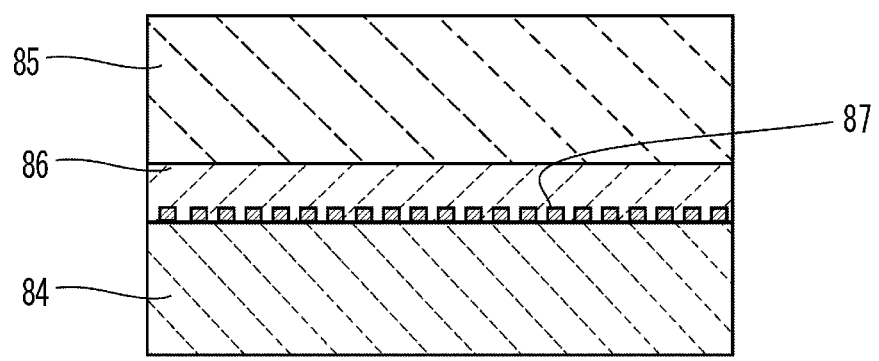
FIG. 18 is a schematic sectional view of a boundary acoustic wave filter.

17, a surface acoustic wave filter 80 includes a piezoelectric body 81 and an IDT electrode 82 provided on the piezoelectric body 81. Alternatively, the ladder elastic wave filter 41 and the longitudinally-coupled-resonator-type elastic wave filter 61 may preferably be boundary acoustic wave filters utilizing boundary acoustic waves. As illustrated in FIG. 18, a boundary acoustic wave filter 83 includes a piezoelectric body 84, a first medium 85 provided above the piezoelectric body 84 and preferably composed of SiN or other suitable material, for example, and a second medium 86 disposed between the first medium 85 and the piezoelectric body 84 and preferably composed of $SiO_2$ or other suitable material, for example. An IDT electrode 87 is provided between the piezoelectric body 84 and the second medium 86.

Next, the configuration of the wiring substrate 10 will be described in detail with reference to FIGS. 5 to 8.

The wiring substrate 10 of this preferred embodiment preferably includes three substrate layers 15 (refer to FIG. 5), (refer to FIGS. 6) and 17 (refer to FIG. 7 and FIG. 8) fired into a single body by a ceramic co-firing technique.

Figure 5:
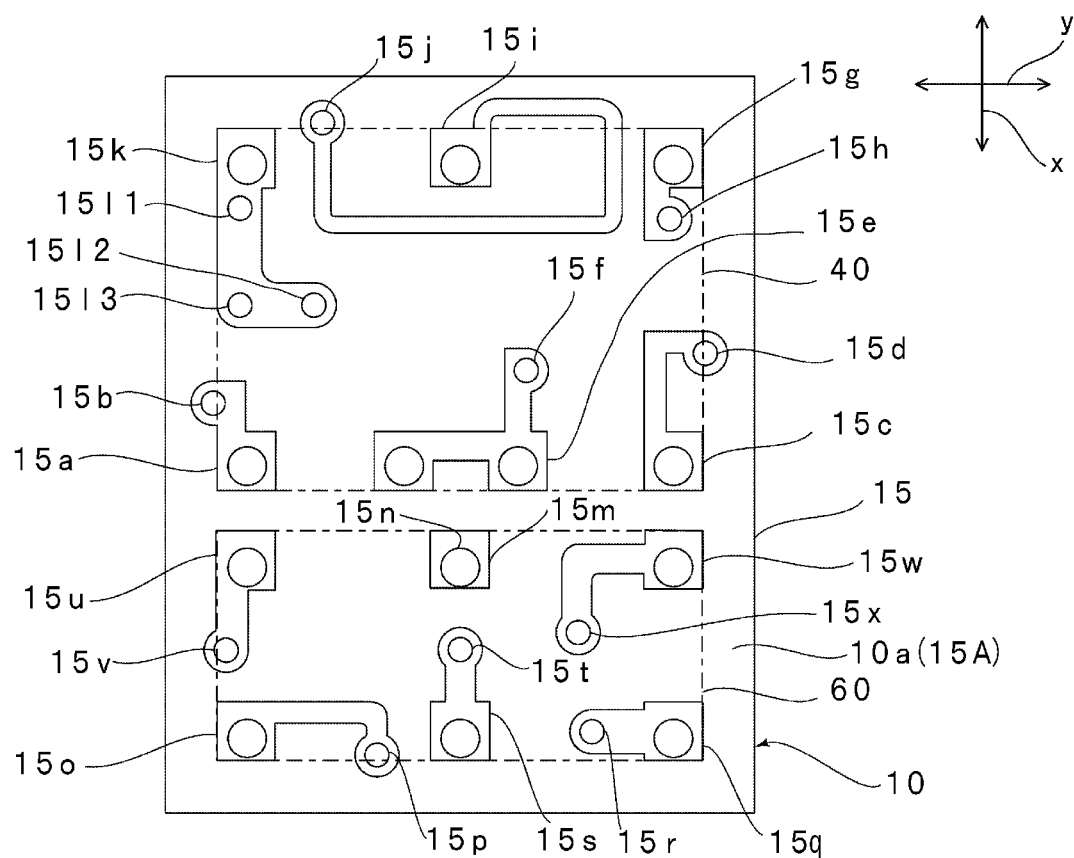
FIG. 5 is a schematic plan view of a first substrate layer in the first preferred embodiment of the present invention.
Figure 6:
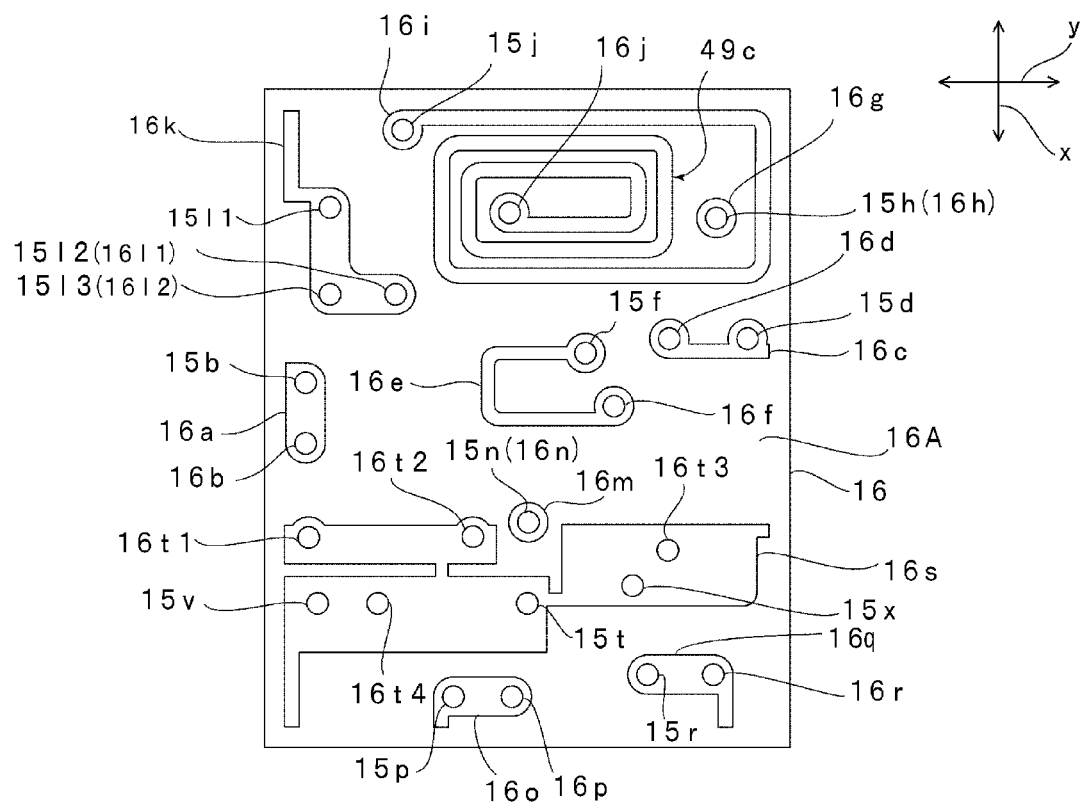
FIG. 6 is a schematic plan view of a second substrate layer in the first preferred embodiment of the present invention.
Figure 7:
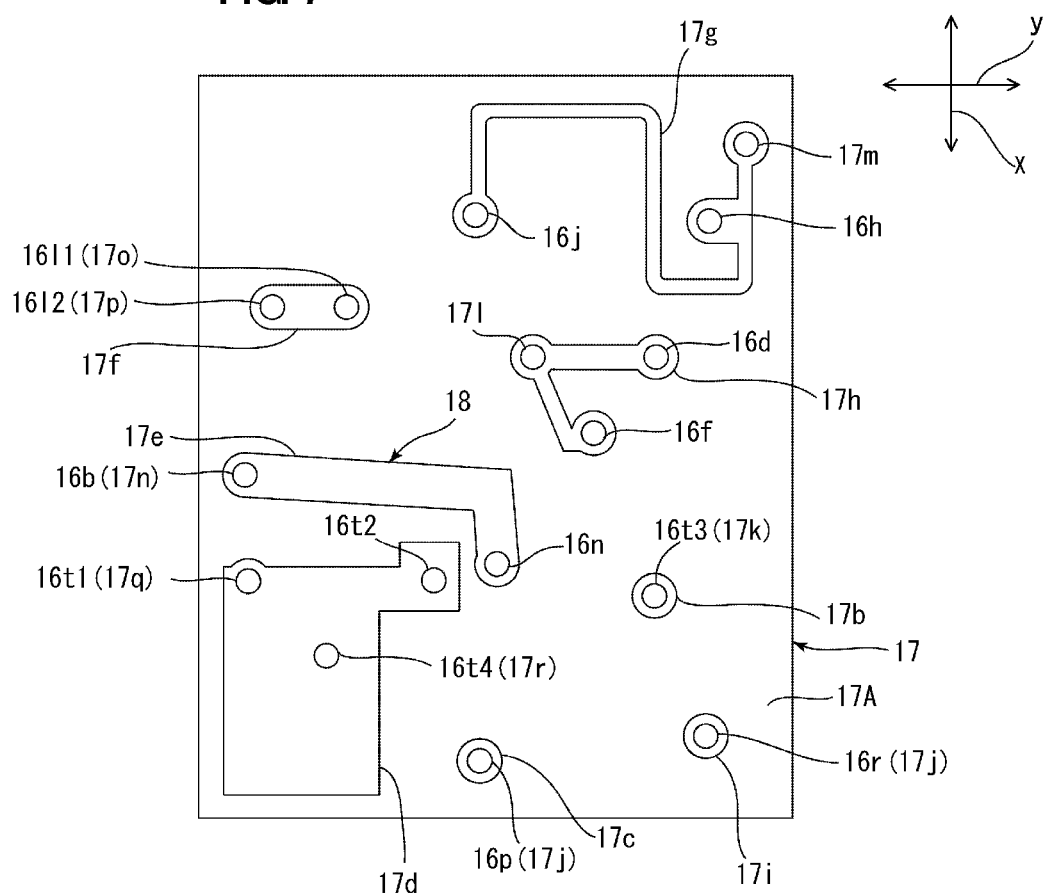
FIG. 7 is a schematic plan view of a third substrate layer in the first preferred embodiment of the present invention.
Figure 8:
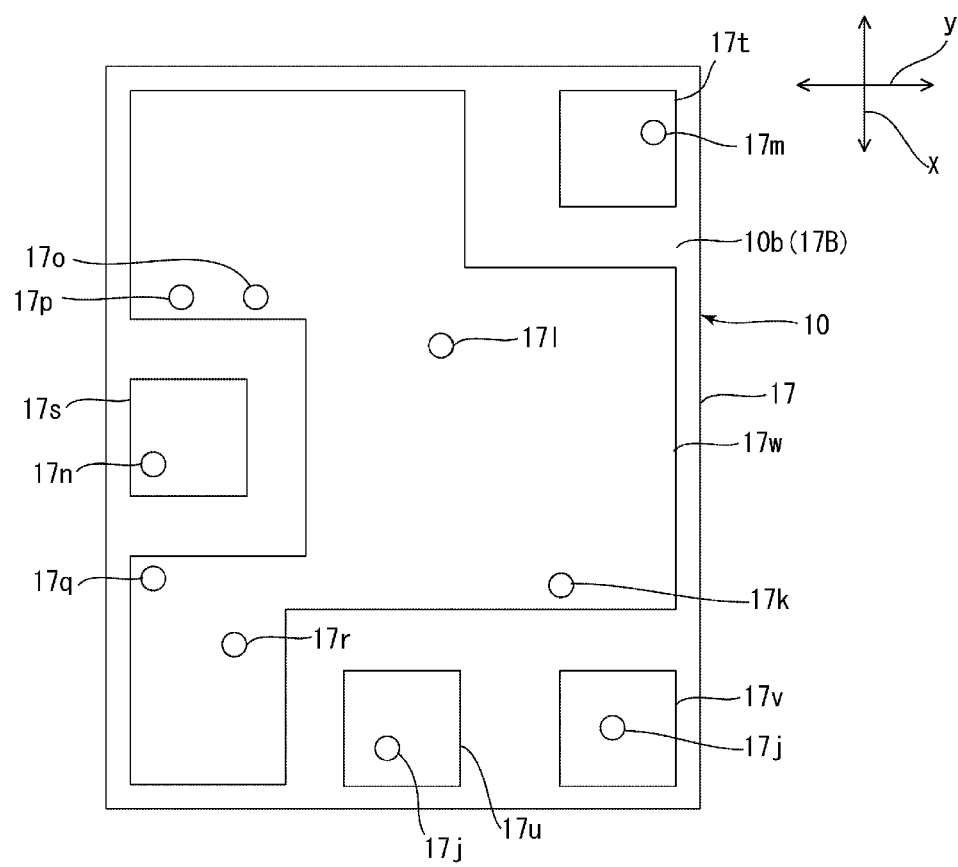
FIG. 8 is a schematic planar transparent view of the third substrate layer in the first preferred embodiment of the present invention.

FIG. 5 is a schematic plan view of a first substrate layer. FIG. 6 is a schematic plan view of a second substrate layer. FIG. 7 is a schematic plan view of a first main surface side of a third substrate layer. For the sake of convenience, FIG. 8 is a schematic planar transparent diagram in which a second main surface side of the third substrate layer is illustrated so as to be seen from a first surface side.

As illustrated in FIG. 5, the first substrate layer 15 includes a main surface 15A. The main surface 15A defines the first main surface 10a of the wiring substrate 10.

As illustrated in FIG. 5, an electrode 15a, which is connected to the bump electrode 45 illustrated in FIG. 3, is provided on the main surface 15A. The electrode 15a is connected to an electrode 16a (refer to FIG. 6) provided on a main surface 16A of the second substrate layer 16 through a via hole electrode 15b, which penetrates through the first substrate layer 15. The electrode 16a is connected to an electrode 17e (refer to FIG. 7) provided on a first main surface 17A of the third substrate layer 17, through a via hole electrode 16b, which penetrates through the second substrate layer 16. The electrode 17e is connected to the antenna back-surface electrode 17s (refer to FIG. 8) provided on a second main surface 17B of the third substrate layer 17 through a via hole electrode 17n, which penetrates through the third substrate layer 17. This antenna back-surface electrode 17s defines the antenna terminal 11 illustrated in FIG. 2.

As illustrated in FIG. 5, an electrode 15g, which is connected to the bump electrode 46 illustrated in FIG. 3, is provided on the main surface 15A. The electrode 15g is connected to an electrode 16g (refer to FIG. 6) provided on the main surface 16A of the second substrate layer 16 through a via hole electrode 15h that penetrates through the first substrate layer 15. The electrode 16g is connected to a transmission signal output electrode 17t (refer to FIG. 8) provided on the second main surface 17B of the third substrate layer 17 through a via hole electrode 16h, an electrode 17g (refer to FIG. 7) and a via hole electrode 17m. The transmission signal output electrode 17t defines the transmission signal terminal 12 illustrated in FIG. 2.

As illustrated in FIG. 5, an electrode 15e, which is connected to the bump electrodes 50a and 50b, and an electrode 15c, which is connected to the bump electrode 50c, are provided on the main surface 15A of the first substrate layer 15. The electrodes 15e and 15c are connected to a ground electrode 17w (refer to FIG. 8), which is provided on the second main surface 17B, through via hole electrodes 15f and 15d, electrodes 16e and 16c (refer to FIG. 6), via hole electrodes 16d and 16f, an electrode 17h (refer to FIG. 7) and a via hole electrode 171. This ground electrode 17w is connected to the ground potential.

Furthermore, as illustrated in FIG. 5, an electrode 15k, which is connected to a bump electrode 50e, is provided on the main surface 15A of the first substrate layer 15. This electrode 15k is also connected to the ground electrode 17w illustrated in FIG. 8 through via hole electrodes 1511 to 1513, an electrode 16k, via hole electrodes 1611 and 1612 (refer to FIG. 6) and electrodes 17f, 17o and 17p (refer to FIG. 7).

As illustrated in FIG. 5, an electrode 15i, which is provided on the main surface 15A of the first substrate layer 15 and is connected to the bump electrode 50d, is connected to the electrode 16i illustrated in FIG. 6 through a via hole electrode 15j. This electrode 16i preferably has a spiral shape and defines the inductor 49c illustrated in FIG. 2. The electrode 16i is connected to the electrode 17g illustrated in FIG. 7 through a via hole electrode 16j. The electrode 17g, as described above, is connected to the transmission signal output electrode 17t illustrated in FIG. 8.

As illustrated in FIG. 5, an electrode 15m, which is connected to the antenna electrode pad 63 through the bump electrode 63a, is provided on the main surface 15A of the first substrate layer 15. The electrode 15m is connected to an electrode 16m, which is provided on the main surface 16A of the second substrate layer 16, through a via hole electrode 15n that penetrates through the first substrate layer 15. The electrode 16m is connected to the electrode 17e (refer to FIG. 7), which is provided on the first main surface 17A of the third substrate layer 17, through a via hole electrode 16n that penetrates through the second substrate layer 16. The electrode 17e, as described above, is connected to the antenna back-surface electrode 17s illustrated in FIG. 8 through the via hole electrode 17n.

In this manner, in the present preferred embodiment, the antenna back surface electrode 17s and the antenna electrode pad 63 are connected to each other through the electrode 15m, the via hole electrode 15n, the electrode 16m, the via hole electrode 16n, the electrode 17e, and the via hole electrode 17n. Among these electrodes, the first wiring 18 is defined by the electrode 17e, which extends in an in-plane direction.

In this preferred embodiment, the first wiring 18 is preferably disposed inside the wiring substrate 10. However, the first wiring 18 may instead be provided on the second main surface 10b (second main surface 17B of third substrate layer 17) of the wiring substrate 10 or may be provided on the first main surface 10a of the wiring substrate 10.

In addition, in this preferred embodiment, referring to FIGS. 4 to 8, the first wiring 18 is preferably superposed with a least one of the first and second functional electrodes and 68 in the first direction x. Specifically, the first wiring 18 is preferably not superposed with the first functional electrode 67 in the first direction x, but is preferably superposed with the second functional electrode 68 in the first direction x.

The antenna back-surface electrode 17s illustrated in FIG. 8 and the antenna electrode pad 63 illustrated in FIG. 4 are preferably provided at different positions when viewed in plan.

An electrode 15o illustrated in FIG. 5 is connected to the electrode pad 66 illustrated in FIG. 4 through the bump electrode 66a. The electrode 15o is connected to a ground electrode 17u illustrated in FIG. 8 through a via hole electrode 15p, an electrode 16o and a via hole electrode 16p (refer to FIG. 6), and an electrode 17c and a via hole electrode 17j (refer to FIG. 7). The ground electrode 17u is connected to the ground potential.

An electrode 15q illustrated in FIG. 5 is connected to the electrode pad 65 illustrated in FIG. 4 through the bump electrode 65a. The electrode 15q is connected to a ground electrode 17v illustrated in FIG. 8 through a via hole electrode 15r, an electrode 16q and a via hole electrode 16r (refer to FIG. 6), and an electrode 17i and the via hole electrode 17j (refer to FIG. 7). The ground electrode 17v is connected to the ground potential.

Electrodes 15u, 15s and 15w (refer to FIG. 5), which are connected to the electrode pads 75 to 77 illustrated in FIG. 4 through the bump electrodes 75a to 77a, are connected to an electrode 16s illustrated in FIG. 6 through via hole electrodes 15v, 15t and 15x. The electrode 16s is connected to an electrode 17b or 17d illustrated in FIG. 7 through via hole electrodes 16t1 to 16t4. The electrode 17b is connected to the ground electrode 17w through a via hole electrode 17k and the electrode 17d is connected to the ground electrode 17w through via hole electrodes 17q and 17r.

Wiring substrates 10 of second and third preferred embodiments of the present invention, which differ only in the electrode structure from the wiring substrate 10 of the first preferred embodiment, will be described in detail below. In the following description, components with substantially the same functions as those of the first preferred embodiment will be referred to using the same symbols and description thereof will be omitted.

Figure 9:
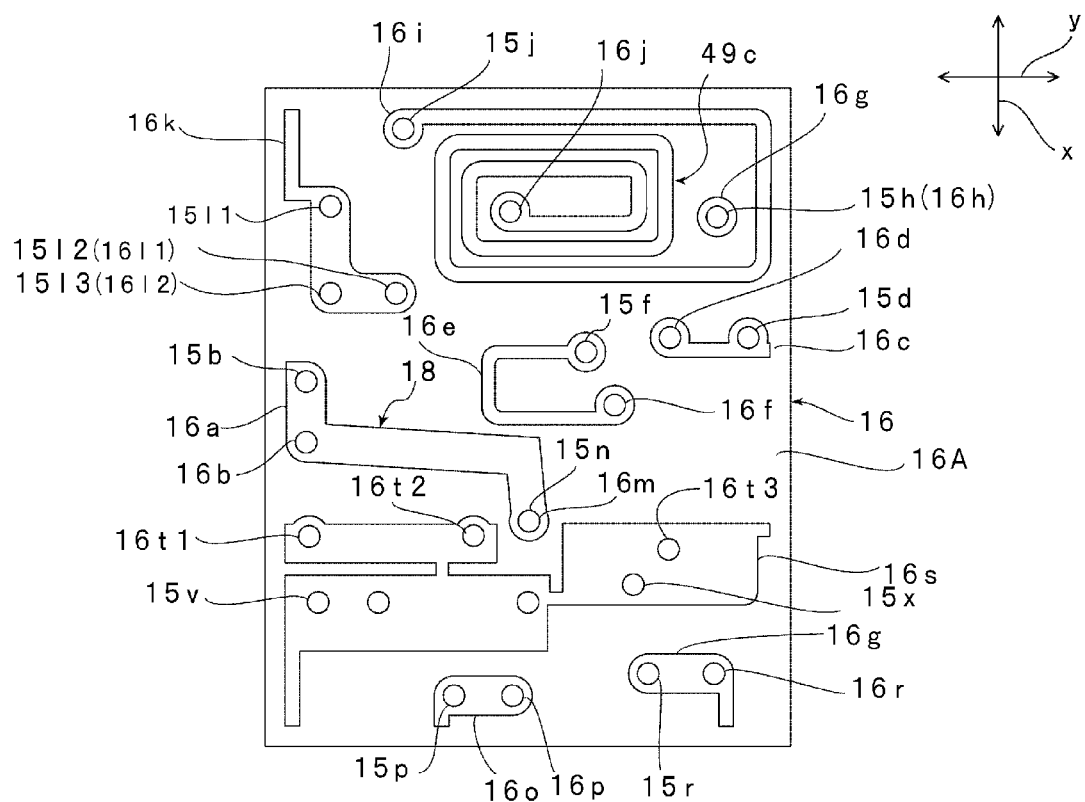
FIG. 9 is a schematic plan view of a second substrate layer in a second preferred embodiment of the present invention.
Figure 10:
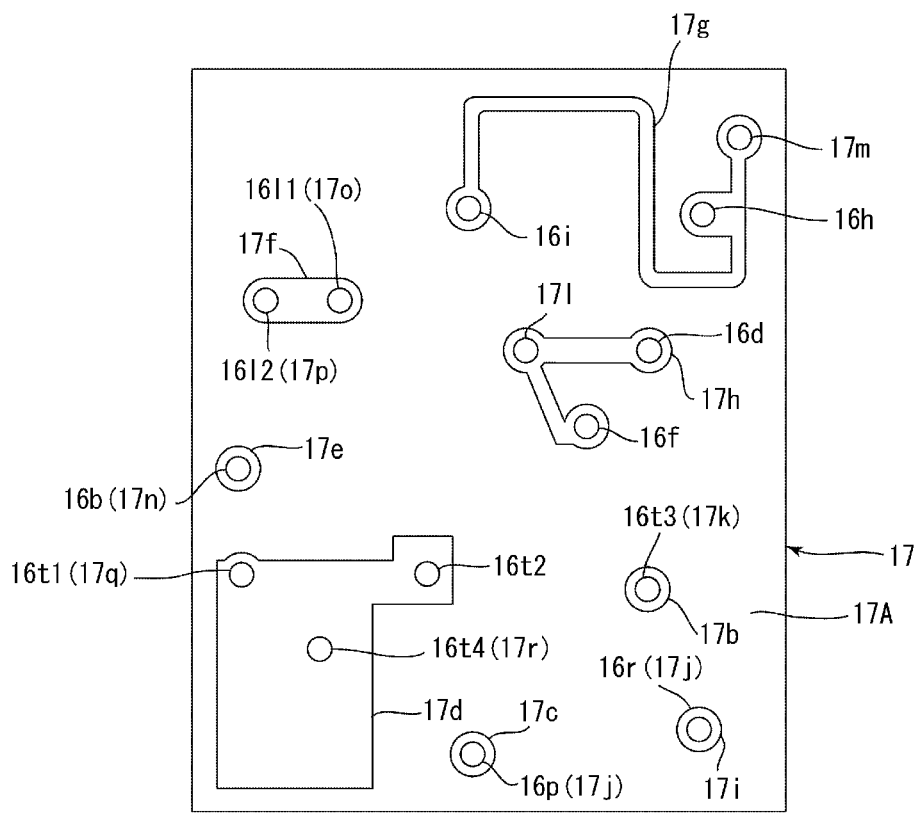
FIG. 10 is a schematic plan view of a third substrate layer in the second preferred embodiment of the present invention.

FIG. 9 is a schematic plan view of the second substrate layer in the second preferred embodiment. FIG. 10 is a schematic plan view of the third substrate layer in the second preferred embodiment.

The second preferred embodiment preferably has substantially the same configuration as the first preferred embodiment, except for the path of the first wiring 18. The configuration of the first substrate layer 15 and the electrode structure of the second main surface 17B of the third substrate layer 17 preferably are substantially the same as those of the first preferred embodiment. In this preferred embodiment, as in the first preferred embodiment, FIGS. 1 to 5 and FIG. 8 are referred to.

In this preferred embodiment, as illustrated in FIG. 9, the electrode 16a and an electrode 16m are connected to each other. The electrode 16a and the electrode 16m are commonly connected to the electrode 17e illustrated in FIG. 10 through the via hole electrode 16b. Consequently, in this preferred embodiment, the first wiring 18 is defined by the electrodes 16a and 16m. Therefore, whereas in the first preferred embodiment, the first wiring 18 is provided on the first main surface 17A of the third substrate layer 17, in the second preferred embodiment the first wiring 18 is provided on the main surface 16A of the second substrate layer 16.

Figure 11:
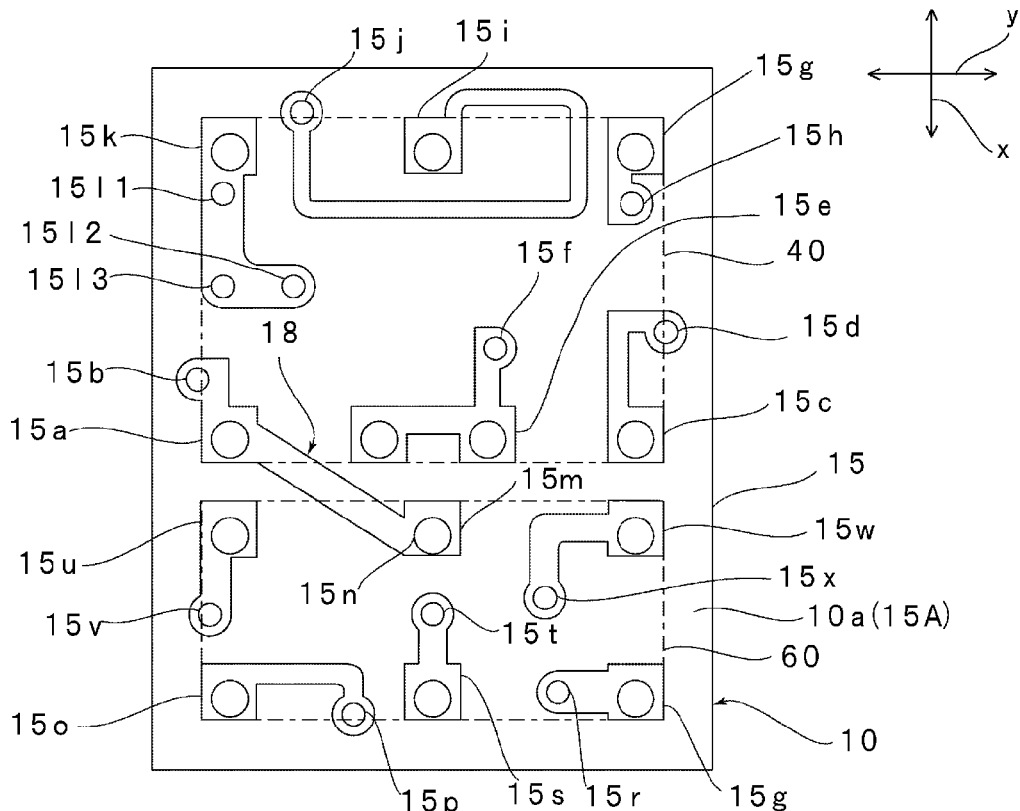
FIG. 11 is a schematic plan view of a first substrate layer in a third preferred embodiment of the present invention.
Figure 12:
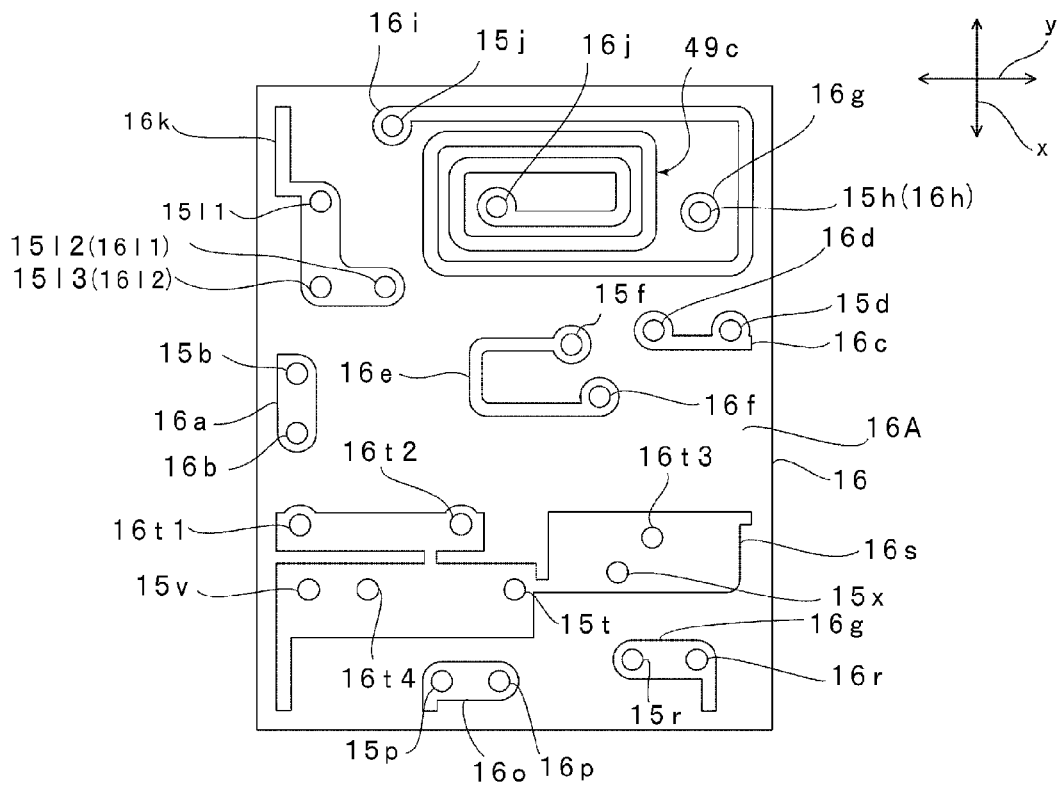
FIG. 12 is a schematic plan view of a second substrate layer in the third preferred embodiment of the present invention.

FIG. 11 is a schematic plan view of the first substrate layer in a third preferred embodiment. FIG. 12 is a schematic plan view of the second substrate layer in the third preferred embodiment.

The third preferred embodiment also has substantially the same configuration as the first preferred embodiment, except for the path of the first wiring 18. In this preferred embodiment, as in the first preferred embodiment, FIGS. 1 to 4 and FIG. 7 and FIG. 8 are referred to.

In this preferred embodiment, as illustrated in FIG. 11, the electrode 15a and an electrode 15m are connected to each other. The electrode 15a and the electrode 15m are commonly connected to the electrode 16a through the via hole electrode 15b. Consequently, in this preferred embodiment, the first wiring 18 is defined by the electrode 15a and the electrode 15m. Therefore, in this preferred embodiment, the first wiring 18 is provided on the main surface 15A of the first substrate layer 15.

In the first to third preferred embodiments, the first functional electrode 67 and the second functional electrode 68 are preferably axisymmetrically arranged with respect to each other about a central axis C, which extends along the first direction x of the second wiring 64, which also extends in the first direction. That is, the distance between the second wiring 64 and the first functional electrode 67 in the first direction x and the distance between the second wiring 64 and the second functional electrode 68 in the first direction x are the same or substantially the same. Consequently, even if parasitic capacitances arise between the second wiring 64 and the first and second functional electrodes 67 and 68, the difference between the parasitic capacitance that arises between the second wiring 64 and the first functional electrode 67 and the parasitic capacitance that arises between the second wiring 64 and the second functional electrode 68 are very small. Therefore, it is not likely that the balance characteristics will be degraded. That is, it is not likely that parasitic capacitances will arise that will degrade the balance characteristics between the first and second reception balanced signal terminals 13a and 13b (refer to FIG. 2). In particular, in this preferred embodiment, the second wiring 64 is not superposed with either of the first and second functional electrodes 67 and 68 in the first direction x. Therefore, parasitic capacitances do not readily arise between the second wiring 64 and first and second functional electrodes 67 and 68.

As long as the first functional electrode 67 and the second functional electrode 68 are axisymmetrically provided with respect to each other about the central axis C that extends in the first direction x of the second wiring 64, which also extends in the first direction x, there are no particular limitations on the electrode structure from the viewpoint of balance characteristics. Therefore, an electrode structure that is advantageous in terms of size reduction can be used. Therefore, according to the first to third preferred embodiments, both excellent balance characteristics and a reduction in size are achieved.

More specifically, in the case in which the ladder elastic wave filter chip 40 has a long narrow shape in a longitudinal direction, an electrode structure is provided for the longitudinally-coupled-resonator-type elastic wave filter 61, such that the longitudinally-coupled-resonator-type elastic wave filter chip 60 has a long narrow shape, and the ladder elastic wave filter chip 40 and the longitudinally-coupled-resonator-type elastic wave filter chip 60 are arranged such that their longitudinal directions are parallel or substantially parallel and thereby the size of the duplexer 1 can be reduced.

For example, in the first to third preferred embodiments of the present invention, the first functional electrode 67 and the second functional electrode 68 are preferably arranged in the second direction y and thereby the longitudinally-coupled-resonator-type elastic wave filter chip 60 has a long narrow shape. The ladder elastic wave filter chip and the longitudinally-coupled-resonator-type elastic wave filter chip 60 are arranged such that their longitudinal directions extend in the second direction y and thereby the size of the duplexer 1 is reduced.

From the viewpoint of improved balance characteristics, rather than the first wiring 18 being provided on the first main surface 10a of the wiring substrate 10 as in the third preferred embodiment, the first wiring 18 is preferably provided within or on the second main surface 10b of the wiring substrate 10 as in the first and second preferred embodiments. This is because, as a result of providing the first wiring 18 within or on the second surface 10b of the wiring substrate 10, electromagnetic field coupling, with which there is a risk of degradation of the balance characteristics, does not readily occur between the first wiring 18 and the longitudinally-coupled-resonator-type elastic wave filter 61.

Hereafter, this advantage will be described in greater detail.

The isolation characteristics between the transmission signal terminal 12 and the first and second reception balanced signal terminals 13a and 13b were measured for each of the duplexers according to the first to third preferred embodiments. The results are illustrated in below Table 1 and FIGS. 13 to 15.

Table 1 illustrates values for actual isolation capability in the Tx band (about 880 MHz to about 915 MHz). Here, the term "value for actual isolation capability" refers to the smallest loss in the Tx band.

Figure 13:
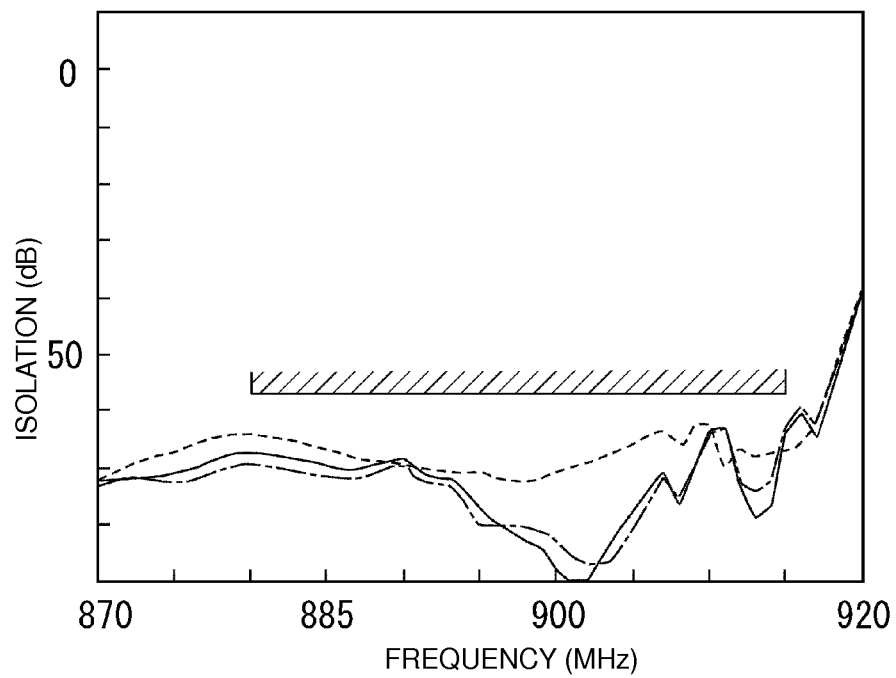
FIG. 13 shows graphs illustrating isolation characteristics of the duplexer according to the first preferred embodiment of the present invention. The graph shown by the solid line illustrates isolation characteristics for a case in which the longitudinally-coupled-resonator-type elastic wave filter chip is mounted at a position in accordance with the design. The graph shown by the alternate dot and dash line illustrates the isolation characteristics for a case in which the mounting position of the longitudinally-coupled-resonator-type elastic wave filter chip has been shifted toward an x2 side in a first direction by about 50 μm. The graph shown by the dotted line illustrates the isolation characteristics for a case in which the mounting position of the longitudinally-coupled-resonator-type elastic wave filter chip has been shifted toward an x1 side in the first direction by about 50 μm.
Figure 14:
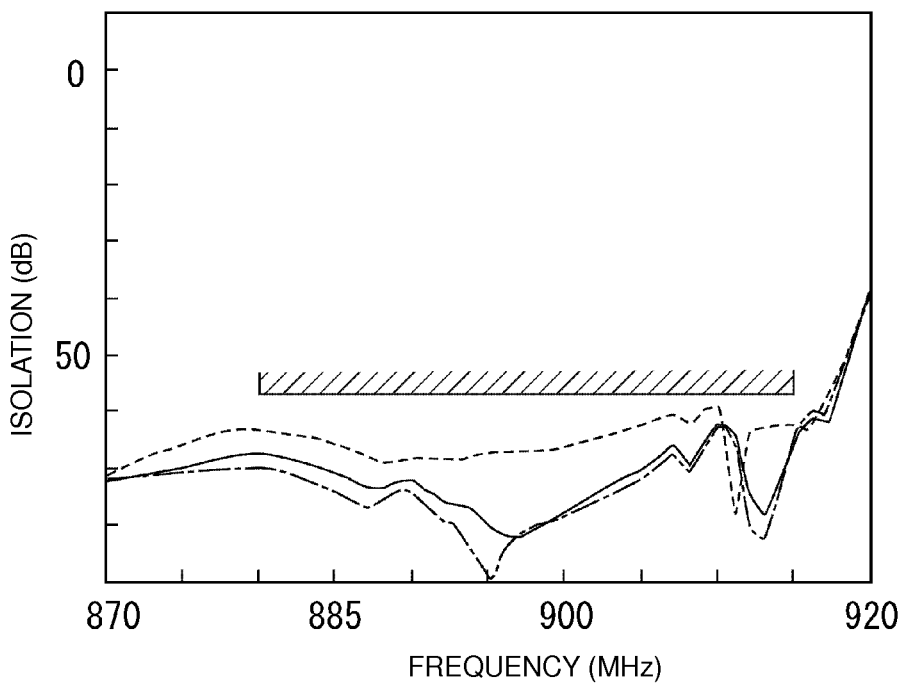
FIG. 14 shows graphs illustrating isolation characteristics for the duplexer according to the second preferred embodiment of the present invention. The graph shown by the solid line illustrates the isolation characteristics for a case in which the longitudinally-coupled-resonator-type elastic wave filter chip has been mounted at a position in accordance with the design. The graph shown by the alternate dot and dash line illustrates the isolation characteristics for a case in which the mounting position of the longitudinally-coupled-resonator-type elastic wave filter chip has been shifted toward the x2 side in the first direction by about 50 μm. The graph shown by the dotted line illustrates the isolation characteristics for a case in which the mounting position of the longitudinally-coupled-resonator-type elastic wave filter chip has been shifted toward the x1 side in the first direction by about 50 μm.
Figure 15:
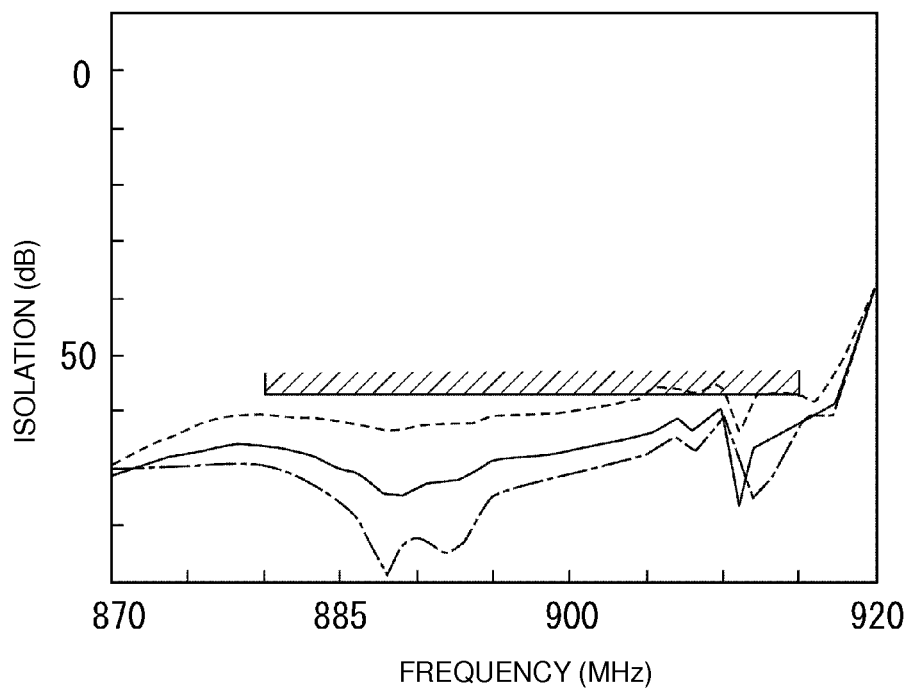
FIG. 15 shows graphs illustrating isolation characteristics for the duplexer according to the third preferred embodiment of the present invention. The graph shown by the solid line illustrates the isolation characteristics for a case in which the longitudinally-coupled-resonator-type elastic wave filter chip has been mounted at a position in accordance with the design. The graph shown by the alternate dot and dash line illustrates the isolation characteristics for a case in which the mounting position of the longitudinally-coupled-resonator-type elastic wave filter chip has been shifted toward the x2 side in the first direction by about 50 μm. The graph shown by the dotted line illustrates the isolation characteristics for a case in which the mounting position of the longitudinally-coupled-resonator-type elastic wave filter chip has been shifted toward the x1 side in the first direction by about 50 μm.

FIG. 13 is a graph illustrating the isolation characteristics of the duplexer according to the first preferred embodiment. FIG. 14 is a graph illustrating the isolation characteristics of the duplexer according to the second preferred embodiment. FIG. 15 is a graph illustrating the isolation characteristics of the duplexer according to the third preferred embodiment. In FIGS. 13 to 15, the graphs shown by the solid lines illustrate the isolation characteristics for the cases in which the longitudinally-coupled-resonator-type elastic wave filter chip 60 has been mounted at a position in accordance with the design. The graphs shown by the alternate dot and dash lines illustrate the isolation characteristics for the cases in which the mounting position of the longitudinally-coupled-resonator-type elastic wave filter chip 60 has been shifted by about 50 μm toward an x2 side in the first direction. The graphs shown by the dotted lines illustrate the isolation characteristics for the cases in which the mounting position of the longitudinally-coupled-resonator-type elastic wave filter chip 60 has been shifted by about 50 μm toward an x1 side in the first direction.

TABLE 1

|  | DESIGN POSITION | 50 μm toward × 2 side | 50 μm toward × 1 side |
| --- | --- | --- | --- |
| FIRST PREFERRED EMBODIMENT | 62.9 db | 62.0 db | 62.2 db |
| SECOND PREFERRED EMBODIMENT | 62.3 db | 59.8 db | 62.2 db |
| THIRD PREFERRED EMBODIMENT | 59.6 db | 55.4 db | 61.0 db |

First, when the cases in which the mounting position of the longitudinally-coupled-resonator-type elastic wave filter chip 60 is at the desired position are compared, it is clear that the duplexers according to the first and second preferred embodiments in which the first wiring 18 is provided within the wiring substrate 10 are superior to the duplexer according to the third preferred embodiment in which the first wiring 18 is provided on the first main surface 10a of the wiring substrate 10. From this result, it is clear that the occurrence of electromagnetic field coupling between the first wiring 18 and the longitudinally-coupled-resonator-type elastic wave filter 61 can be minimized or prevented and that the balance characteristics can be improved when the first wiring 18 is provided inside the wiring substrate 10.

Furthermore, comparing FIG. 13 and FIG. 14, it is clear that the isolation characteristics of the duplexer according to the first preferred embodiment in which the first wiring 18 is provided on the first main surface 17A of the third substrate layer 17 are superior to those of the duplexer according to the second preferred embodiment in which the first wiring 18 is provided on the main surface 16A of the second substrate layer 16. From this result, it is clear that the isolation characteristics can be further improved by providing the first wiring 18 at a position spaced apart from the first main surface 10a of the wiring substrate 10.

Furthermore, since the occurrence of electromagnetic field coupling between the first wiring 18 and the longitudinally-coupled-resonator-type elastic wave filter 61 can be minimized or prevented in the first and second preferred embodiments, even if there is a shift in the mounting position of the longitudinally-coupled-resonator-type elastic wave filter chip 60, it is not likely that the isolation characteristics will change. Therefore, the positional accuracy required for mounting the longitudinally-coupled-resonator-type elastic wave filter chip 60 is relatively low and duplexers can be efficiently manufactured.

The advantage of minimizing or preventing electromagnetic field coupling is particularly emphasized when the first functional electrode 67 and the second functional electrode 68 are independent from each other with respect to the propagation of elastic waves.

Hereafter, modified examples of preferred embodiments of the present invention will be described. In the following description of the modified examples, components having substantially the same functions as those in the preferred embodiments will be referred to using the same symbols and description thereof will be omitted.

Figure 16:
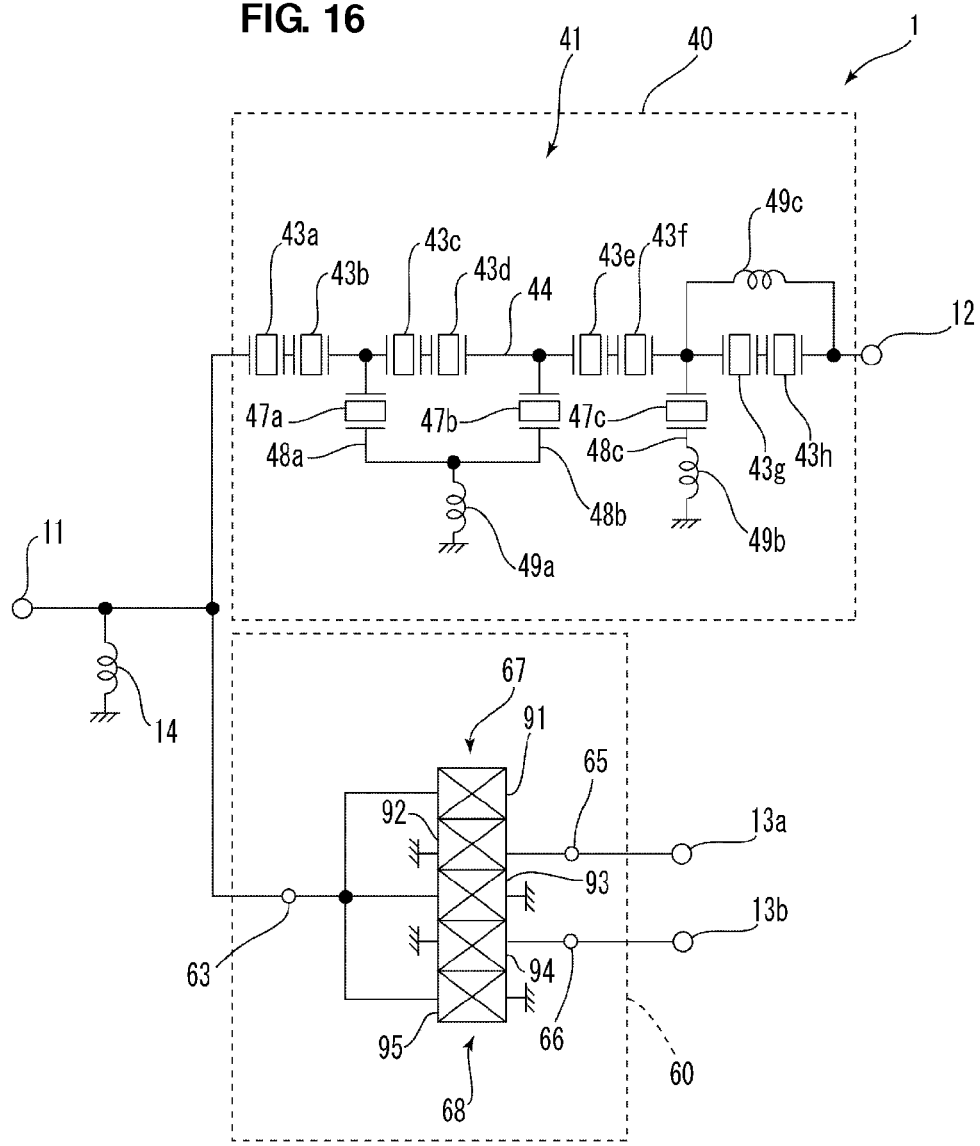
FIG. 16 is an equivalent circuit diagram of a duplexer according to a first modified example of a preferred embodiment of the present invention.
Figure 17:
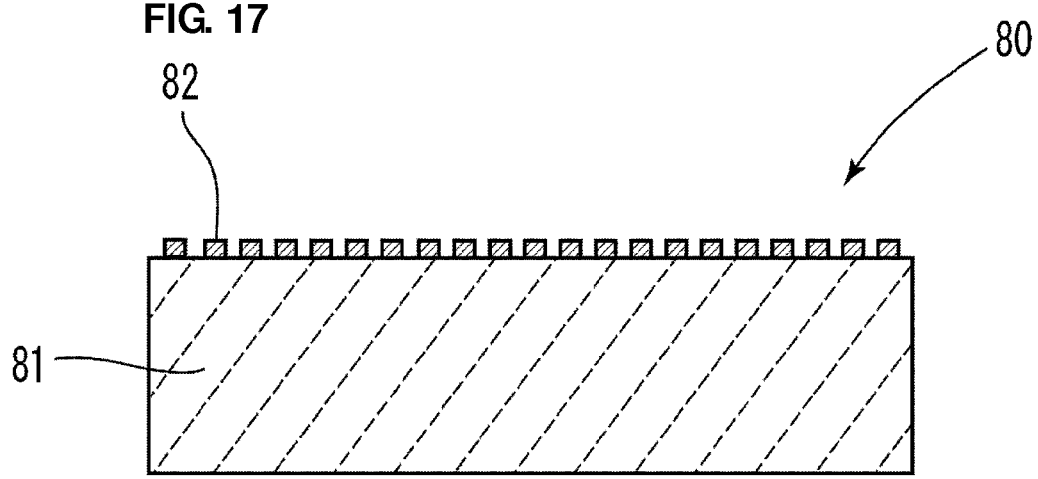
FIG. 17 is a schematic sectional view of a surface acoustic wave filter.

In the first to third preferred embodiments, a case was described in which the first and second functional electrodes 67 and 68 are each defined by two longitudinally-coupled-resonator-type elastic wave filters each including three IDT electrodes. However, preferred embodiments of the present invention are not limited to this configuration. For example, each of the first and second functional electrodes may instead be defined by a single longitudinally-coupled-resonator-type elastic wave filter including a plurality of IDT electrodes. Furthermore, for example, as illustrated in FIG. 16, the first and second functional electrodes may preferably include first to fifth IDT electrodes 91 to 95 arranged in this order in the elastic wave propagation direction. In the case illustrated in FIG. 16, the first functional electrode 67 preferably includes the first IDT electrode 91, the second IDT electrode 92, and a portion of the third IDT electrode 93 and the second functional electrode 68 preferably includes the remaining portion of the third IDT electrode 93, the fourth IDT electrode 94, and the fifth IDT electrode 95.

Figure 19:
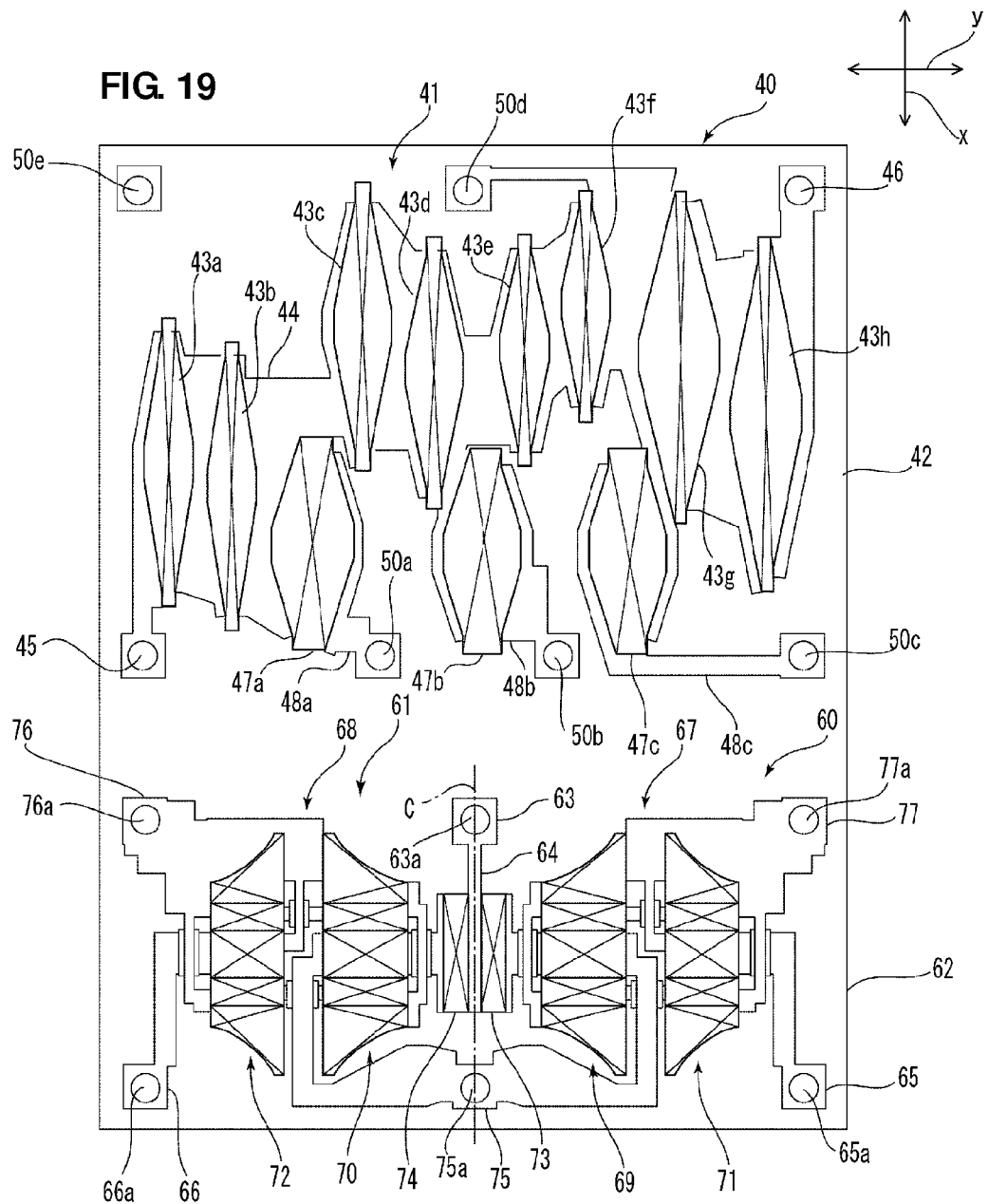
FIG. 19 is a schematic planar transparent view of a filter chip of a second modified example of a preferred embodiment of the present invention.

In addition, in the first preferred embodiment, a case was described in which the piezoelectric substrate 42 and the piezoelectric substrate 62 are separately provided. However, preferred embodiments of the present invention are not limited to this configuration. For example, as illustrated in FIG. 19, the piezoelectric substrate 42 and the piezoelectric substrate 62 may preferably be provided in an integrated manner. That is, the ladder elastic wave filter chip 40 and the longitudinally-coupled-resonator-type elastic wave filter chip 60 may preferably be provided in an integrated manner.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A branching filter comprising:
    an antenna terminal;
    a transmission signal terminal;
    first and second reception balanced signal terminals;
    a wiring substrate including first and second main surfaces;
    a ladder elastic wave filter chip mounted on the first main surface of the wiring substrate and including a first piezoelectric substrate and a ladder elastic wave filter that is provided on the first piezoelectric substrate, the ladder elastic wave filter chip being connected between the antenna terminal and the transmission signal terminal; and
    a longitudinally-coupled-resonator-type elastic wave filter chip mounted on the first main surface of the wiring substrate; wherein
    the wiring substrate includes an antenna back-surface electrode provided on the second main surface and connected to the antenna terminal, and a first wiring connected to the antenna back-surface electrode;
    the longitudinally-coupled-resonator-type elastic wave filter chip includes:
        a second piezoelectric substrate;
        a longitudinally-coupled-resonator-type elastic wave filter provided on the second piezoelectric substrate, connected between the antenna terminal and the first and second reception balanced signal terminals, and being configured to have a balanced-unbalanced transformation function;
        an antenna electrode pad provided on the second piezoelectric substrate and connected to the antenna back-surface electrode through the first wiring; and
        a second wiring provided on the second piezoelectric substrate and connecting the antenna electrode pad and the longitudinally-coupled-resonator-type elastic wave filter;
    the longitudinally-coupled-resonator-type elastic wave filter includes a first functional electrode that is connected between the second wiring and the first reception balanced signal terminal and a second functional electrode that is connected between the second wiring and the second reception balanced signal terminal;
    the second wiring extends in a first direction, and the first functional electrode and the second functional electrode are axisymmetrically arranged with respect to each other about a central axis that extends in the first direction of the second wiring;
    the ladder elastic wave filter chip has a long narrow shape with a longitudinal direction that is parallel or substantially parallel to a second direction perpendicular or substantially perpendicular to the first direction; and
    the first wiring includes a portion that is directly connected to the antenna electrode pad, is disposed inside the wiring substrate, and extends in the first direction.

2. The branching filter according to claim 1, wherein the antenna electrode pad is provided at a position that is different from that of the antenna back-surface electrode when viewed in plan.

3. The branching filter according to claim 1, wherein the first wiring is spaced away from at least one of the first and second functional electrodes in the first direction.

4. The branching filter according to claim 1, wherein the first functional electrode includes a first longitudinally-coupled-resonator-type elastic wave filter including a plurality of IDT electrodes arranged along an elastic wave propagation direction parallel or substantially parallel to the first direction;
    the second functional electrode includes a second longitudinally-coupled-resonator-type elastic wave filter including a plurality of IDT electrodes arranged along the elastic wave propagation direction; and
    the first longitudinally-coupled-resonator-type elastic wave filter and the second longitudinally-coupled-resonator-type elastic wave filter are arranged along the second direction.

5. The branching filter according to claim 4, wherein
    the first functional electrode further includes a third longitudinally-coupled-resonator-type elastic wave filter that is cascade-connected with the first longitudinally-coupled-resonator-type elastic wave filter between the first longitudinally-coupled-resonator-type elastic wave filter and the first reception balanced signal terminal;
    the second functional electrode further includes a fourth longitudinally-coupled-resonator-type elastic wave filter that is cascade-connected with the second longitudinally-coupled-resonator-type elastic wave filter between the second longitudinally-coupled-resonator-type elastic wave filter and the second reception balanced signal terminal; and
    the first to fourth longitudinally-coupled-resonator-type elastic wave filters are arranged along the second direction.

6. The branching filter according to claim 1, wherein
    the longitudinally-coupled-resonator-type elastic wave filter includes first to fifth IDT electrodes arranged in an elastic wave propagation direction parallel or substantially parallel to the second direction;
    at least a portion of the first functional electrode includes the first and second IDT electrodes and a portion of the third IDT electrode; and
    at least a portion of the second functional electrode includes the fourth and fifth IDT electrodes and a remaining portion of the third IDT electrode.

7. The branching filter according to claim 1, wherein the first piezoelectric substrate of the ladder filter and the second piezoelectric substrate of the longitudinally-coupled-resonator-type elastic wave filter are provided in an integrated manner.

8. The branching filter according to claim 1, wherein the ladder filter and the longitudinally-coupled-resonator-type elastic wave filter are surface acoustic wave filters that utilize surface acoustic waves or boundary acoustic wave filters that utilize boundary acoustic waves.

* * * * *